United States Patent
Okada et al.

(10) Patent No.: US 8,803,161 B2
(45) Date of Patent: Aug. 12, 2014

(54) SEMICONDUCTOR DEVICE AND SOLID STATE RELAY USING SAME

(75) Inventors: Hiroshi Okada, Mie (JP); Takuya Sunada, Osaka (JP); Takeshi Oomori, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/700,331

(22) PCT Filed: Feb. 23, 2011

(86) PCT No.: PCT/IB2011/000361
§ 371 (c)(1),
(2), (4) Date: Nov. 27, 2012

(87) PCT Pub. No.: WO2011/151682
PCT Pub. Date: Dec. 8, 2011

(65) Prior Publication Data
US 2013/0069082 A1    Mar. 21, 2013

(30) Foreign Application Priority Data

Jun. 3, 2010 (JP) ................................. 2010-128095

(51) Int. Cl.
*H01L 31/0312* (2006.01)

(52) U.S. Cl.
USPC ............................... 257/77; 257/84; 257/355

(58) Field of Classification Search
USPC ........................ 257/76, 77, 84, 355
See application file for complete search history.

(56) References Cited

U.S. PATENT DOCUMENTS

| 5,296,723 A * | 3/1994 | Nobe et al. ...................... 257/82 |
| 2003/0098462 A1 | 5/2003 | Yoshida |
| 2007/0170436 A1* | 7/2007 | Sugawara ........................ 257/77 |
| 2010/0128403 A1* | 5/2010 | Li et al. ............................ 361/56 |
| 2011/0012130 A1* | 1/2011 | Zhang .............................. 257/77 |
| 2011/0089765 A1* | 4/2011 | Iwata et al. ..................... 307/82 |

FOREIGN PATENT DOCUMENTS

| JP | H02-000912 | 1/1990 |
| JP | H03-209776 | 9/1991 |
| JP | H08-204533 | 8/1996 |
| JP | 2003-229566 | 8/2003 |
| JP | 2004-281171 | 10/2004 |
| JP | 2007-135081 | 5/2007 |
| JP | 2007-266475 | 10/2007 |
| JP | 2012-533881 | 12/2012 |
| WO | 2009/116273 | 9/2009 |

OTHER PUBLICATIONS

International Search Report for corresponding International Application No. PCT/IB2011/000361 mailed Nov. 22, 2011.
Form PCT/ISA/237 for corresponding International Application No. PCT/IB2011/000361 dated Nov. 22, 2011.
Japanese Office Action dated Apr. 15, 2014 for corresponding Japanese Application No. 2010-128095 and English summary thereof.

* cited by examiner

*Primary Examiner* — Phuc Dang
(74) *Attorney, Agent, or Firm* — Renner, Otto, Boisselle & Sklar, LLP

(57) ABSTRACT

A semiconductor device includes one or more unipolar compound semiconductor element; and bypass semiconductor elements externally connected to the respective compound semiconductor elements in parallel. A turn-on voltage of the bypass semiconductor elements is smaller than a turn-on voltage of the compound semiconductor elements in the direction from the source to the drain.

7 Claims, 6 Drawing Sheets

SEMICONDUCTOR DEVICE AND SOLID STATE RELAY USING SAME

FIELD OF THE INVENTION

The present invention relates to a semiconductor device and a solid state relay using same; and, more particularly, to a semiconductor device employing a compound semiconductor such as a SiC and a solid state relay using same.

BACKGROUND OF THE INVENTION

There has been known a light-coupled solid state relay including a light emitting element, which emits lights according to an input signal, and a light receiving element which receives an optical signal from the light emitting element to produce an electromotive force by which an output MOSFET (Metal-Oxide-Semiconductor Field Effect Transistor) is turned on and off (see, e.g., Japanese Patent Application Publication No. H08-204533 (JPh08-204533A)). The solid state relay has been employed for various uses because it has a small on-resistance, a small volume, and can control a minute analog signal.

FIG. 11 shows a configuration of a conventional solid state relay. As shown in FIG. 11, the solid state relay includes: a light emitting element 110, such as an LED, which generates an optical signal in response to an input signal inputted from input terminals T1 and T2; a photoelectric conversion unit 120 including a photodiode array 121 which receives the optical signal and produces an electromotive force and a charge and discharge circuit 122 which charges and discharges the produced electromotive force; and an output elements 130 (130a and 130b) including two output MOSFETs 131a and 131b, respectively, each of which is turned on or turned off according to a voltage from the charge and discharge circuit 122.

As for such output MOSFETs 130a and 130b, SiC-MOSFETs made of SiC has drawn attention thanks to their high withstand voltage and small on-resistance.

FIG. 12 shows the configuration of each of the output MOSFETs 130a and 130b. Specifically, an n type epitaxial growth layer 2 is formed on an n type SiC substrate 1, a p type well region 3 is formed on the n type epitaxial growth layer 2 and a source 4 formed of an n type diffusion layer is formed on the p type well region 3. Further, a gate electrode 7 is formed on a surface of the p type well region 3 via a gate insulating film 6 formed of a silicon oxide layer. A channel region is also provided on the surface of the p type well region 3. The reference numerals "5" and "9" indicate a source electrode and a drain electrode, respectively. In addition, body diodes 132a and 132b are formed between the p type well region 3 and the epitaxial growth layer 2. The reference characters "Rch," "Repi" and "Rsub" indicates channel resistance, epitaxial layer resistance and substrate resistance.

When a positive voltage and a negative voltage are respectively applied to a drain and a source, the MOSFET is turned on or off through a channel depending on whether or not a predetermined voltage is applied to the gate electrode 7. However, when a positive voltage and a negative voltage are respectively applied to the source and the drain, a forward-direction voltage is applied to a pn junction of the body diode 132a (132b), so that a current flows in a forward direction of the body diode 132a (132b) regardless of whether or not the predetermined voltage is applied to the gate electrode 7.

A compound semiconductor such as a SiC has a problem in that the increase of crystal defects is caused by the current flowing in the forward direction of the pn junction diode. The on-resistance has the epitaxial layer resistance Repi and the substrate resistance Rsub. Consequently, in the case of the SiC substrate, a current flowing in the forward direction causes the increase of crystal defects. This results in the increase of the on-resistance of a SiC-MOSFET, which should be solved.

In the meantime, a switching element is employed in a power conversion device such as an inverter for converting a direct current (DC) to an alternating current (AC), a converter for converting AC to DC, and the like. As for the switching element, there has been suggested a FET (Field Effect Transistor) made of a compound semiconductor such as a SiC semiconductor, a GaN semiconductor or the like. The compound semiconductors are suitable for high-temperature processes since they have high bandgap energy and heat resistant temperature. Accordingly, by using a FET made of such a compound semiconductor material, it is possible to reduce the cost for cooling elements and obtain a high withstand voltage (see, e.g., Japanese Patent Application Publication No. 2003-229566 (JP2003-229566A)). In this cited reference, there is used a substrate on which a power FET serving as a switching element and a protection element such as a GaN based Schottky diode or the like are integrated together.

There has also been suggested a FET whose nitride-based compound semiconductor layer is formed on a substrate. The FET and a diode serving as a protection element for the FET are integrated to be connected in parallel (see, e.g., Japanese Patent Application Publication No. 2007-266475 (JP2007-266475A)). This is to reduce the power loss by suppressing the leakage caused by threading dislocation generated when a nitride-based compound semiconductor layer is formed [Paragraph 0044]. In this example, by providing a diode to a FET, it is possible to make the current avoid the threading dislocations which are generated perpendicularly to the substrate.

As described above, a SiC-MOSFET used as an output switching element, i.e., an output element of the solid state relay disclosed in JPh08-204533A, may cause further increase in the on-resistance due to the increase of crystal defects.

Further, in JP2003-229566A and JP2007-266475A, there is disclosed an example where a protection element is connected in parallel to a nitride-based compound semiconductor element in a nitride-based compound semiconductor device. However, aging effects caused by the multiple repetition of turning on and off the semiconductor element is not mentioned therein. Additionally, since the semiconductor element and the protection element are integrated, the current flows even in the nitride-based compound semiconductor device.

In this nitride-based compound semiconductor device, the current is controlled to flow, avoiding the threading dislocations that are generated perpendicularly to the substrate. In fact, the current flows in the high-resistance epitaxial growth layer. Further, due to the high power consumption, it is difficult to satisfactorily reduce the power consumption.

It is also difficult to integrate the protection element, and thus it is necessary to form a contact region having a deep depth in the substrate, or parasitic elements are increased, as in JP2003-229566A and JP2007-266475A. In addition, the integration of the protection element is affected by the heat emission caused by the electric field in the protection element or the current generated when a power is supplied. Such crystal defects may also be increased in various compound semiconductor FETs such as GaN-based FETs as well as the SiC-MOSFETs.

SUMMARY OF THE INVENTION

In view of the above, the present invention provides a semiconductor device having high reliability, capable of reducing the increase in on-resistance.

In accordance with an aspect of the present invention, there is provided a semiconductor device including one or more unipolar compound semiconductor elements; and bypass semiconductor elements externally connected to the respective compound semiconductor elements in parallel, wherein a turn-on voltage of the bypass semiconductor elements is smaller than a turn-on voltage of the compound semiconductor elements in the direction from the source to the drain.

Each of the bypass semiconductor elements may be formed of a silicon diode, and a drain and a source of each of the compound semiconductor elements may be respectively connected to a cathode and an anode of the corresponding silicon diode.

Each of the bypass semiconductor elements may be formed of a Si-MOSFET, and a drain and a source of each of the compound semiconductor elements may be respectively connected to a cathode and an anode of the corresponding Si-MOSFET.

Each of the bypass semiconductor elements may be formed of a SiC-Schottky diode, and a drain and a source of each of the compound semiconductor elements may be respectively connected to a cathode and an anode of the corresponding SiC-Schottky diode.

Each of the compound semiconductor elements may be formed of a SiC-FET or a GaN-FET.

The compound semiconductor elements may be connected in anti-series with their sources in common.

In accordance with another aspect of the present invention, there is provided a solid state relay including the semiconductor device; a light emitting element configured to emit lights in response to an input signal; a photodiode array which receives the lights and generates a power; and a charge and discharge circuit connected to the photoelectric array in parallel, wherein gates and sources of the compound semiconductor elements included in the semiconductor device are connected to opposite ends of the photodiode array, respectively.

In accordance with the aspects of the present invention, the bypass semiconductor elements are externally connected in parallel to the respective compound semiconductor elements. Further, the turn-on voltage of the bypass semiconductor elements is smaller than the turn-on voltage of the compound semiconductor elements in the direction from the source to the drain. Accordingly, the bypass semiconductor elements are turned on before the current flows from the source of each of the compound semiconductor elements to the drain thereof. Thus, it is possible to prevent the increase of crystal defects of the epitaxial growth layer (or substrate) formed on the surface of a SiC wafer caused by the power-on of the SiC-pn (body) diode, thereby suppressing the increase in On-resistance of the SiC-MOSFETs. It is especially possible to apply same to the devices, such as solid state relays and the like, which have a high repetition number of switching to prevent the increase of crystal defects.

DETAILED DESCRIPTION OF THE EMBODIMENTS

Embodiments of the present invention will now be described with reference to the accompanying drawings which form a part hereof.

(First Embodiment)

A solid state relay in accordance with a first embodiment of the present invention features an output element formed of a compound semiconductor element, e.g., a SiC-MOSFET to which a silicon diode is externally connected, the silicon diode being employed as a protection element for the output element. A semiconductor device of the present embodiment includes at least one unipolar compound semiconductor element serving as the output element; and bypass semiconductor elements serving as the protection element, the bypass semiconductor elements being externally connected in parallel to the compound semiconductor elements, respectively. At this time, the turn-on voltage of the bypass semiconductor elements is smaller than the turn-on voltage of the compound semiconductor elements in the direction from the source to the drain.

The solid state relay of the present embodiment includes a light emitting element which emits lights in response to an input signal; a photodiode array which receives the lights to generate an electric power; and a charge and discharge circuit connected in parallel to the photodiode array. The gate and the source of each of the compound semiconductor elements are connected to opposite ends of the photodiode array via the charge and discharge circuit.

Figure 1:
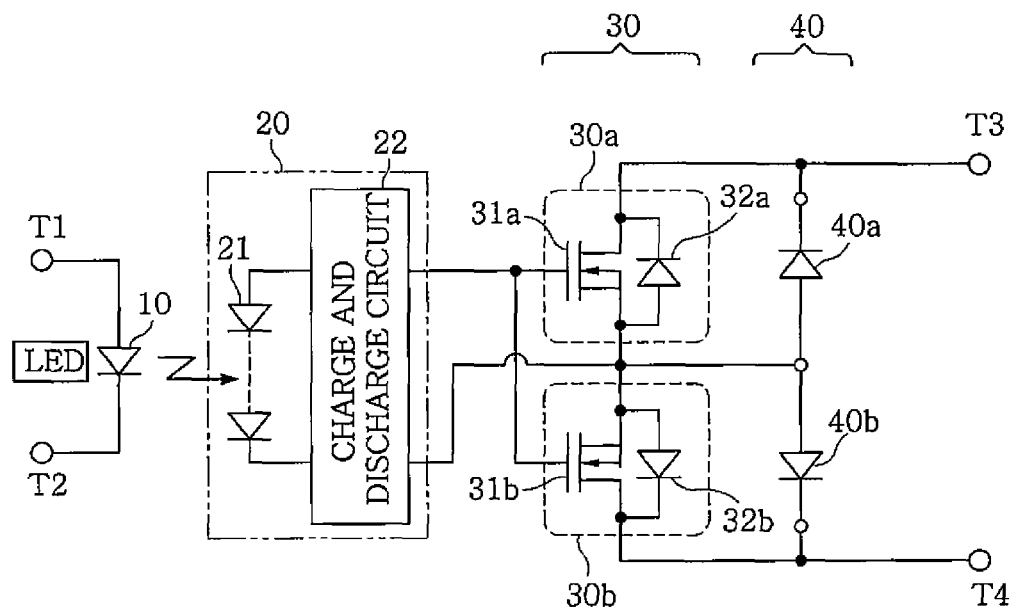
FIG. 1 is an equivalent circuit view showing a solid state relay in accordance with a first embodiment of the present invention.
Figure 2:
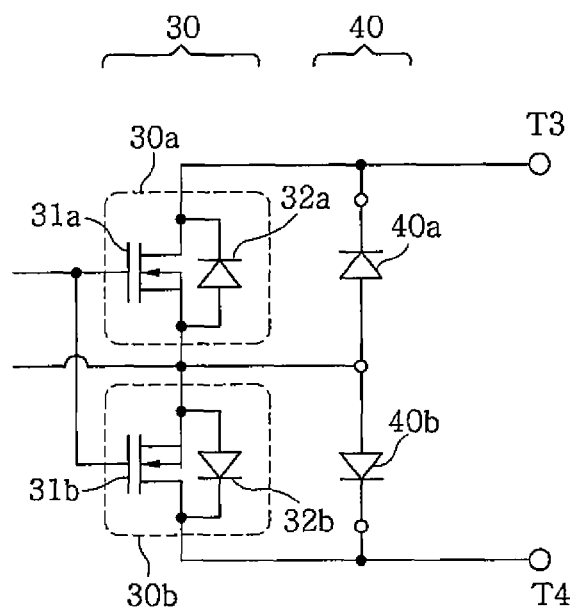
FIG. 2 is an equivalent circuit view showing an output element employed in the solid state relay.
Figure 3A:
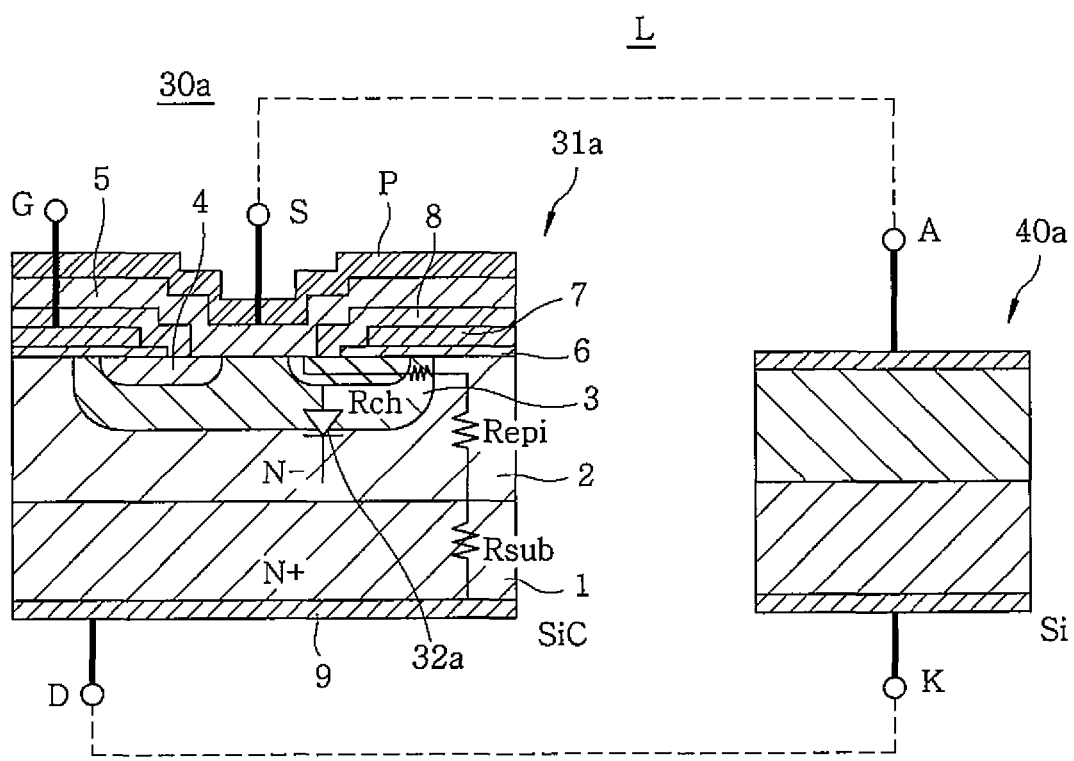
FIG. 3A shows an example of an output element chip to which a silicon diode is externally connected in accordance with the first embodiment of the present invention and FIG. 3B is an equivalent circuit view of FIG. 3A.
Figure 3B:
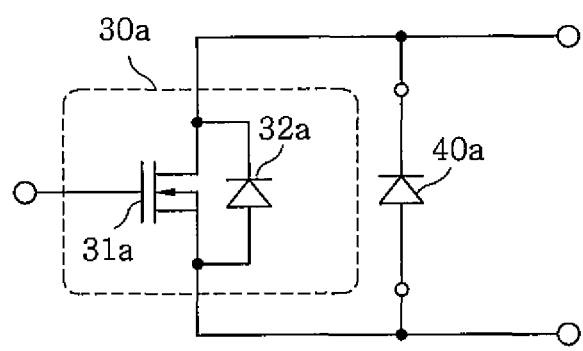

FIG. 1 is an equivalent circuit view showing the solid state relay and FIG. 2 is an equivalent circuit view showing the output element and the protection element. FIG. 3A shows an example of an output element chip to which a silicon diode is externally connected in accordance with the first embodiment of the present invention and FIG. 3B is an equivalent circuit view of FIG. 3A.

Drains "D" of SiC-MOSFETs 31*a* and 31*b* included in the output elements 30 (30*a* and 30*b*) are respectively connected to cathodes "K" of bypass silicon diodes 40*a* and 40*b*. Anodes "A" of the bypass silicon diodes 40a and 40b are respectively connected in anti-series to sources "A" of the SiC-MOSFETs 31a and 31b. Further, the bypass silicon diodes 40a and 40b are respectively connected to the SiC-MOSFETs 31a and 31b through lines "L." In FIGS. 3A and 3B, only one SiC-MOSFET 31a and one silicon diode 40a are illustrated, but the same two SiC-MOSFETs and two silicon diodes are arranged as shown in FIG. 1. Further, built-in SiC body diodes 32a and 32b are respectively connected in parallel to the SiC-MOSFETs 31a and 31b.

As shown in FIG. 1, the solid state relay of the present embodiment includes a light emitting element 10; a photoelectric conversion device 20; and output elements 30 (30a and 30b). The light emitting element 10 includes an LED having a first and a second input terminal T1 and T2. The photoelectric conversion device 20 includes a photodiode array 21 which produces an electromotive force in accordance with the light emission of the light emitting element 10 to output a thus-generated voltage; and a charge and discharge circuit 22 which charges and discharges the voltage outputted from the photodiode array 21. The output elements 30 are turned on and off by applying an output voltage of the photodiode array 21 to gates.

Here, the output elements 30 are two output elements, i.e., SiC-MOSFETs 31a and 31b whose channel between the drain and the source is on or off, to which SiC body diodes 32a and 32b serving as protective elements are respectively connected in parallel. The SiC body diodes 32a and 32b are built-in diodes each of which is a pn junction diode formed between a p type well region 3 and an epitaxial growth layer 2 as shown in FIG. 3A.

As shown on the left side of FIG. 3A, each of the output elements 30 (30a and 30b) includes the n type epitaxial growth layer 2 formed on a first surface of the n type SiC substrate 1. The n type SiC substrate has a desired concentration by the epitaxy; and the p type well region 3p formed on the n type epitaxial growth layer 2. On the p type well region 3, an n type source 4, serving as an impurity region, is formed. A gate electrode 7 is formed on an upper layer of the source 4 via a gate insulating film 6.

This gate electrode 7 is extended between the adjacent p type well regions to control the formation of channel on the surface of the p type well region 3. A source electrode 5 is formed on an upper layer of the gate electrode 7 via an insulating film 8, e.g., a silicon oxide film. The insulating film 8 is provided to cover an entire part of the substrate 1 except for a contact region of the source 4 as well as gate electrode 7. Further, a drain electrode 9 is formed on a rear surface, i.e., a second surface of the n type SiC substrate 1. Reference character "P" indicates a passivation film formed of a polyimide film or the like to cover the first surface of the substrate 1.

Gates "G" of the two SiC-MOSFETs 31a and 31b are respectively connected to an anode of the photodiode array 21 and sources thereof connected to each other in anti-series are connected to a cathode of the photodiode array 21. Further, drains of SiC-MOSFETs 31a and 31b are respectively connected to a first and a second output terminal T3 and T4.

Figure 4:
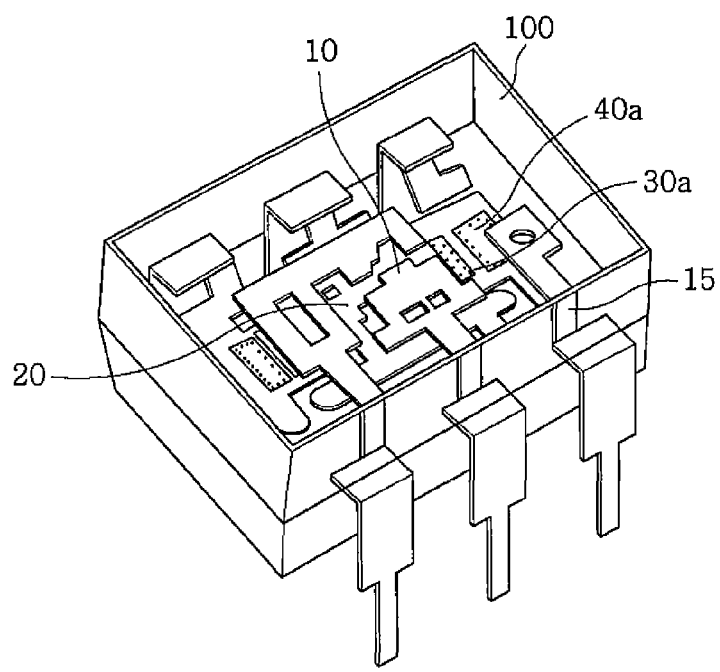
FIG. 4 is a partially broken perspective view showing the solid state relay in accordance with the first embodiment of the present invention.
Figure 5:
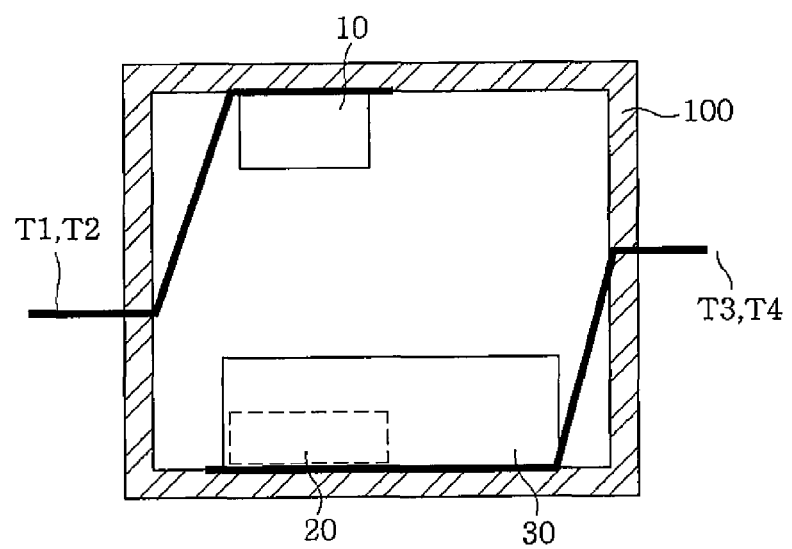
FIG. 5 is a schematic cross sectional view showing the solid state relay.

FIGS. 4 and 5 are a broken perspective view and a schematic cross sectional view, respectively, showing an example of the solid state relay in accordance with the first embodiment. The solid state relay includes a lead frame 15 on which the light emitting element 10, the photoelectric conversion device 20 and the output elements 30 are mounted. The light emitting element 10 is turned on and off in accordance with an input signal. The photoelectric conversion device 20 includes the photodiode array 21 that receives an optical signal from the light emitting element 10 to produce an electromotive force by photoelectric conversion; and the charge and discharge circuit 22 that charges and discharges a power generated by the photodiode array 21. The output elements 30 respectively include the SiC-MOSFETs 31a and 31b that are supplied with output voltages from the photoelectric conversion device 20 (the output elements 30 further includes SiC-body diodes 32a and 32b).

When a gate voltage of the SiC-MOSFET reaches a preset voltage level, the SiC-MOSFET goes into a conduction state to turn on a load. Here, reference numerals "T1" and "T2," "T3" and "T4," and "100" indicate "input terminals," "output terminals" and "resin package," respectively. As shown in FIG. 5, the light emitting element 10 and the photoelectric conversion device 20 are mounted to face each other in such a way that lights emitted from the light emitting element 10 reach the photodiode array 21.

Next, an operation of the above-configured solid state relay of the first embodiment will be described.

The light emitting element 10 emits lights in accordance with an input signal inputted from the first terminal T1 or the second terminal T2 to produce an optical signal. The photodiode array 21 receives the optical signal from the light emitting element 10 and produces an electromotive force at opposite ends thereof to output a thus-generated voltage.

The charge and discharge circuit 22 serves to charge and discharge the voltage outputted from the photoelectric array 21 to apply it to the gates of the SiC-MOSFET 31a and 31b forming the output element 30 (30a or 30b). Then, when the output voltage of the photoelectric array 21 applied to the SiC-MOSFETs 31a and 31b is higher than a threshold voltage $V_{th}$, a channel between the drain and the source of the SiC-MOSFET 31a or 31b is on, and thus an electric connection between the first and the second output terminal T3 and T4 is made to close the relay.

In the meantime, when no input signal is inputted through the first and the second input terminal T1 and T2, no voltage is outputted from the photoelectric conversion device 20, so that the channel between the drain and the source of the SiC-MOSFET 31a or 31b is off. Accordingly, the first and the second output terminal T3 and T4 are disconnected to open the relay.

As described above, the SiC-MOSFETs 31a and 31b serving as the output elements 30 employed in the solid state relay of the first embodiment are connected in anti-series. Further, the silicon diodes 40a and 40b are externally respectively connected to the SiC-MOSFETs 31a and 31b through the lead frames 15. Accordingly, in the resin package 100, the silicon diodes 40a and 40b are connected to the SiC-MOSFETs 31a and 31b as bypass elements while suppressing the operations of parasitic elements (SiC-body diodes 32 (32a and 32b)).

A forward-direction drop voltage $V_f$ (about 3 V) of a SiC-pn diode serving as the SiC body diode 32 is greater than a forward-direction drop voltage $V_f$ (about 0.6 V) of the silicon diode. Accordingly, when a positive voltage and a negative voltage are respectively applied to the source and the drain, a current, which is scheduled to flow through the SiC-pn diode (SiC body diode 32a or 32b) if no silicon diode is provided, bypasses it to the silicon diode 40a or 40b. As a result, it is possible to prevent the increase of crystal defects of the epitaxial growth layer (or substrate) formed on the surface of a SiC wafer caused by the power-on of the SiC-pn diode, thereby suppressing the increase in on-resistance of the SiC-MOSFETs. As such, the output contact reliability of the relay can be maintained even when the relay is repeatedly used.

Each of the output elements 30a and 30b may be formed of a GaN-FET instead of the SiC-FET. In this case, when a voltage that is equal to or higher than a withstand voltage of the GaN-FET 31a is applied thereto, the voltage is also applied to the GAN-FET 31b. At this time, when the silicon diode 40b is not connected to the GaN-FET 31b, the forward-direction voltage is applied between the drain and the source of the GaN-FET 31b. The distance between the drain and the source is too close to be easily short-circuited. However, in the output elements 30 of the present embodiment, the silicon diodes serving as the protection elements are respectively connected thereto in parallel, so that the currents flow in the silicon diodes. As a result, it is possible to prevent the source-gate short circuit.

As described above, the protection elements 40a and 40b are respectively connected to the SiC-MOSFETs 31a and 31b. Accordingly, it is possible to suppress the increase of crystal defects caused by the repetitive power-on of body diodes and improve the reliability of the output elements. In addition to such beneficial effects, the solid state relay has the following characteristics.

1) Since the externally connected silicon diodes are used as the protective elements, it is easy to manufacture a highly reliable semiconductor device with a simple configuration. Further, since the optical coupling is used, the input and the output can be completely separated from each other.

2) Since the power SiC-MOSFET is employed as the load switch, no chattering or mechanical noise is generated. Since the load switch has a high directionality in the on state, it is possible to control an analog signal.

3) Since output circuits are configured by connecting FETs in anti-series, they are available for AC and DC elements.

Figure 6:
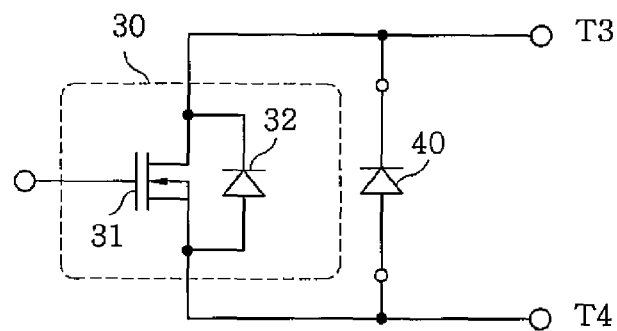
FIG. 6 is an equivalent circuit view showing a modification of an output element used in the solid state relay.

In the first embodiment, the two anti-series connected SiC-MOSFETs 31a and 31b are used. Alternatively, as shown in FIG. 6, a single SIC-MOSFET 31 serving as the output element 30 to which one silicon diode 40 is connected in parallel may be employed.

(Second Embodiment)

Figure 7:
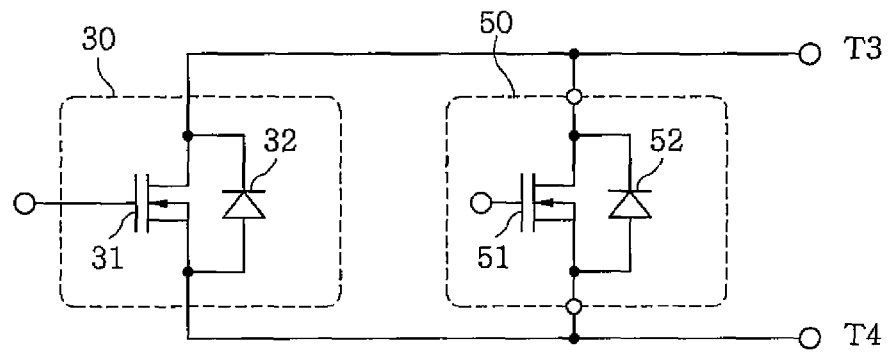
FIG. 7 is an equivalent circuit view showing an output element used in a solid state relay in accordance with a second embodiment of the present invention.

As shown in FIG. 7, in a semiconductor device in accordance with a second embodiment, a bypass semiconductor element, serving as a protection element, is formed of a Si-MOSFET 51 in such a way that a drain and a source of the Si-MOSFET 51 are respectively connected to the drain and the source of the SiC-MOSFET 31.

Comparing a body diode 52 provided with the Si-MOSFET 51 and the SiC-pn (body) diode 32 connected in parallel in the direction from the source to the drain in the above configuration, a forward-direction drop voltage $V_f$ (about 0.6 V) of the body diode 52 is smaller than a forward-direction drop voltage $V_f$ (about 3 V) of a SiC-pn (body) diode 32.

Accordingly, when a positive voltage and a negative voltage are respectively applied to the source and the drain, a current, which is scheduled to flow through the SiC-pn (body) diode 32 if no body diode 52 is provided, will bypass it to the body diode 52 of the Si-MOSFET 51.

As a result, it is possible to prevent the increase of crystal defects of the epitaxial growth layer and a substrate caused by the power-on of the SiC-pn (body) diode, thereby suppressing the increase in on-resistance of the SiC-MOSFET.

(Third Embodiment)

Figure 8:
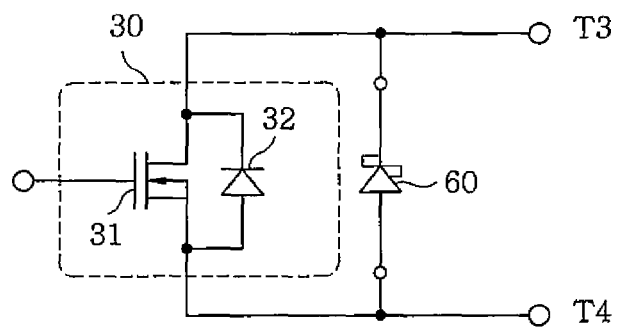
FIG. 8 is an equivalent circuit view showing an output element used in a solid state relay in accordance with a third embodiment of the present invention.

As shown in FIG. 8, in a semiconductor device in accordance with a third embodiment, a bypass semiconductor element serving as a protection element is a SiC-Schottky diode 60 in such a way that a cathode and an anode of the SiC-Schottky diode 60 are respectively connected to the drain and the source of the SiC-MOSFET 31.

Figure 9:
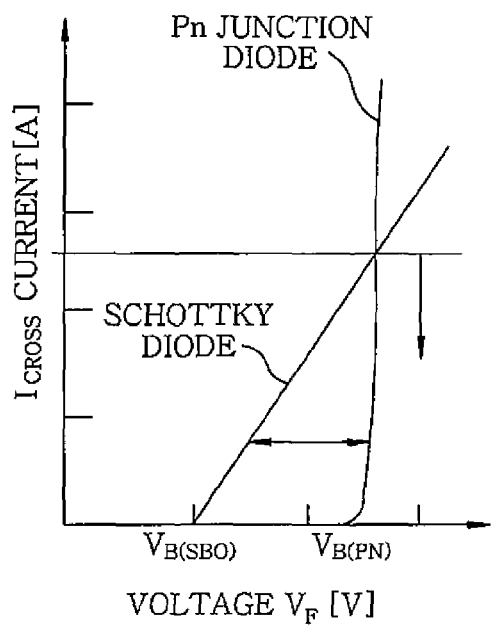
FIG. 9 is a graph showing the result of measuring the relationship between a voltage and a conduction current.

FIG. 9 is a graph showing the result of measuring the relationship between a voltage and a conduction current in the SiC-Schottky diode 60 and the SiC-pn (body) diode 32 that are connected in parallel in the direction from the source to the drain. As shown in FIG. 9, when the conduction current is equal to or lower than a crossover current $I_{cross}$, a forward-direction drop voltage $V_f$ (curve "b") of the SiC-Schottky diode 60 is smaller than a forward-direction drop voltage $V_f$ (curve "a") of a SiC-pn (body) diode 32. Accordingly, when a positive voltage and a negative voltage are respectively applied to the source and the drain, a current, which is scheduled to flow through the SiC-pn (body) diode 32 if no SiC-Schottky diode 60 is provided, will bypass it to the SiC-Schottky diode 60 in the case where the conduction current is equal to or lower than the crossover current $I_{cross}$.

Figure 10:
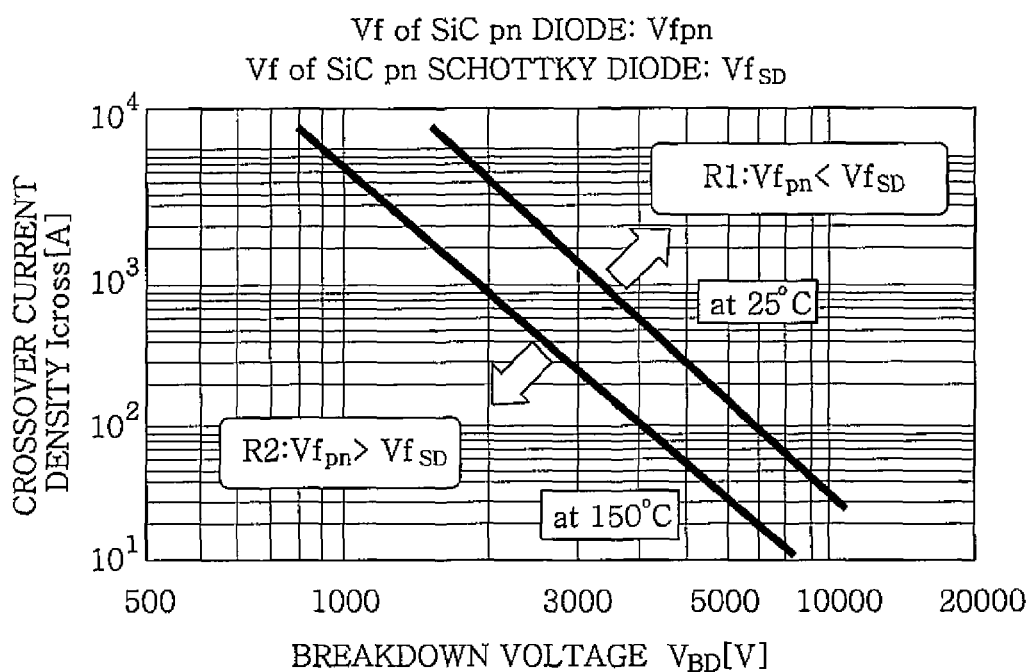
FIG. 10 is a graph showing the result of measuring the relationship between a breakdown voltage and a crossover current.
Figure 11:
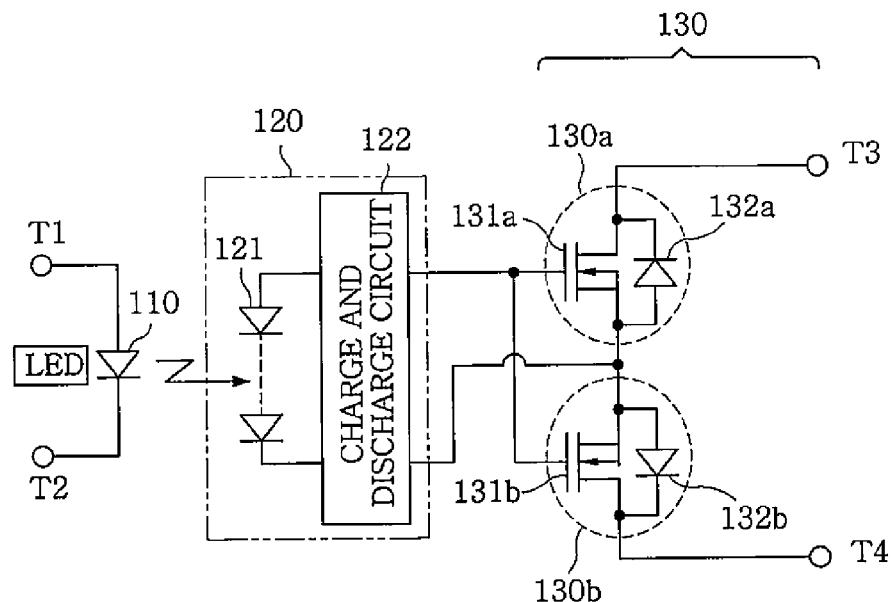
FIG. 11 is an equivalent circuit view showing a conventional solid state relay.
Figure 12:
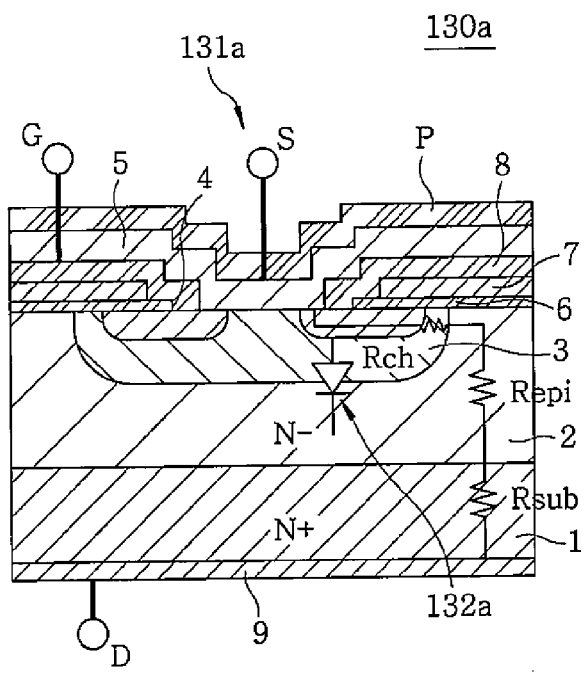
FIG. 12 is a cross sectional view showing a SiC MOSFET chip used in the conventional solid state relay.

FIG. 10 is a graph showing the result of measuring the relationship between a breakdown voltage and a crossover current $I_{cross}$. As shown in FIG. 10, when a same voltage is applied thereto, there exist a region "R1" where the conduction current of the SiC-pn diode becomes larger and a region "R2" where the conduction current of the SiC-Schottky diode also becomes larger.

As a result, it is possible to prevent the increase of crystal defects of the epitaxial growth layer (or substrate) caused by the power-on of the SiC-pn (body) diode, thereby suppressing the increase in on-resistance of the SiC-MOSFET. Further, it is possible to show high heat resistance of SiC as compared with the first and the second embodiments employing the Si-diode and the Si-MOSFET, respectively.

Although the SiC-MOSFETs are employed in the first to the third embodiments, other compound semiconductor FETs such as GaN-based compound semiconductor FETs and the like, may be employed. Accordingly, it is possible to prevent the gate breakdown of a GaN-FET. A measure is generally prepared to deal with a withstand voltage between the gate and the drain. Since, however, the withstand voltage is lower between the gate and the source, there is a drawback in voltage application between the gate and the source. Therefore, in accordance with the embodiments of the present invention, it is possible to prevent the gate breakdown.

Further, in the case where the compound semiconductor elements are connected in anti-series with their sources in common, when a voltage that is larger than the withstand voltage of a first GaN-based MOSFET is applied thereto momentarily, the voltage may also be applied to a second GaN-based MOSFET. At this time, if a diode serving as the protection element is not provided, the voltage may exceed the withstand voltage between the source and the gate. However, in accordance with the embodiments of the present invention, by using an externally connecting bypass protection element, it is possible to prevent the gate breakdown.

The above-mentioned embodiments of the present invention may be applied to compound semiconductor FETs such as Schottky gate FETs and the like without being limited to the SiC-MOSFETs, the GaN-MOSFETs or the like.

While the invention has been shown and described with respect to the embodiments, it will be understood by those skilled in the art that various changes and modifications may be made without departing from the scope of the invention as defined in the following claims.

What is claimed is:
1. A semiconductor device comprising:
   one or more unipolar compound semiconductor elements; and
   one or more bypass semiconductor elements externally connected to the respective compound semiconductor elements in parallel, wherein a turn-on voltage of the bypass semiconductor elements is smaller than a turn-on voltage of the compound semiconductor elements in a direction from a source to a drain.

2. The semiconductor device of claim 1, wherein each of the bypass semiconductor elements is formed of a silicon diode, and a drain and a source of each of the compound semiconductor elements are respectively connected to a cathode and an anode of the corresponding silicon diode.

3. The semiconductor device of claim 1, wherein each of the bypass semiconductor elements is formed of a Si-MOSFET, and a drain and a source of each of the compound semiconductor elements are respectively connected to a cathode and an anode of the corresponding Si-MOSFET.

4. The semiconductor device of claim 1, wherein each of the bypass semiconductor elements is formed of a SiC-Schottky diode, and a drain and a source of each of the compound semiconductor elements are respectively connected to a cathode and an anode of the corresponding SiC-Schottky diode.

5. The semiconductor device of claim 1, wherein each of the compound semiconductor elements is formed of a SiC-FET or a GaN-FET.

6. The semiconductor device of claim 1, wherein the compound semiconductor elements are connected in anti-series with their sources in common.

7. A solid state relay comprising:

the semiconductor device of claim 1;

a light emitting element configured to emit lights in response to an input signal;

a photodiode array which receives the lights and generates a power; and a charge and discharge circuit connected to the photoelectric array in parallel, wherein gates and sources of the compound semiconductor elements included in the semiconductor device are connected to opposite ends of the photodiode array, respectively.

* * * * *